United States Patent
Choi

(10) Patent No.: US 6,856,268 B2
(45) Date of Patent: Feb. 15, 2005

(54) CONTROL SYSTEMS HAVING AN ANALOG CONTROL UNIT THAT GENERATES AN ANALOG VALUE RESPONSIVE TO A DIGITAL VALUE AND HAVING TWICE THE RESOLUTION OF THE LEAST SIGNIFICANT BIT OF THE DIGITAL VALUE AND METHODS OF OPERATING THE SAME

(75) Inventor: Jung-hwan Choi, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/811,759

(22) Filed: Mar. 29, 2004

(65) Prior Publication Data

US 2004/0196170 A1 Oct. 7, 2004

(30) Foreign Application Priority Data

Apr. 1, 2003 (KR) ................................ 10-2003-0020443

(51) Int. Cl.[7] .............................................. H03M 1/66
(52) U.S. Cl. ........................ 341/144; 341/131; 341/143; 341/158
(58) Field of Search .......................... 341/131, 143–144, 341/158, 163–165

(56) References Cited

U.S. PATENT DOCUMENTS

| 5,589,832 A | * | 12/1996 | Grundvig et al. | ............ 341/161 |
| 5,608,399 A | * | 3/1997 | Coleman, Jr. | ................ 341/139 |
| 5,691,720 A | * | 11/1997 | Wang et al. | ................. 341/143 |
| 6,404,372 B1 | * | 6/2002 | Heithoff | ...................... 341/155 |

* cited by examiner

Primary Examiner—Michael Tokar
Assistant Examiner—Khai M. Nguyen
(74) Attorney, Agent, or Firm—Myers Bigel Sibley & Sajovec

(57) ABSTRACT

A control system includes a digital control unit that is configured to generate a digital value responsive to a difference between an output analog value and a reference value. A control signal generating unit is configured to generate a control signal. An analog control unit includes a first circuit that is configured to generate a first analog value responsive to the digital value and a second circuit that is configured to generate a second analog value responsive to the control signal. The second circuit is configured to generate the second analog value at a resolution that is twice that of a resolution of the first circuit with respect to a least significant bit of the digital value. The analog control unit is configured to combine the first and second analog values to generate the output analog value.

30 Claims, 8 Drawing Sheets

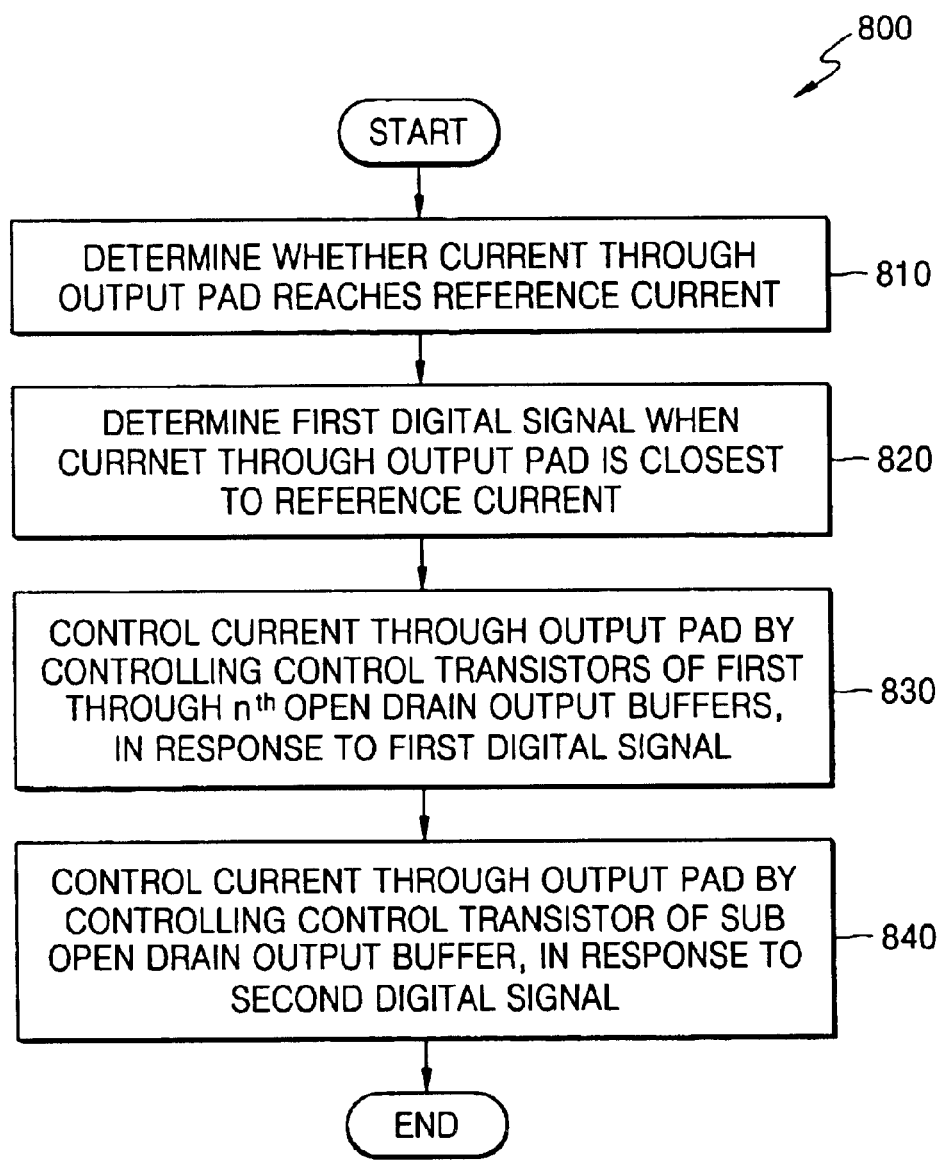

United States Patent

CONTROL SYSTEMS HAVING AN ANALOG CONTROL UNIT THAT GENERATES AN ANALOG VALUE RESPONSIVE TO A DIGITAL VALUE AND HAVING TWICE THE RESOLUTION OF THE LEAST SIGNIFICANT BIT OF THE DIGITAL VALUE AND METHODS OF OPERATING THE SAME

RELATED APPLICATION

This application claims the benefit of Korean Patent Application No. 2003-20443, filed Apr. 1, 2003, the disclosure of which is hereby incorporated herein by reference.

FIELD OF THE INVENTION

The present invention relates generally to integrated circuit devices and methods of operating the same and, more particularly, to current control circuits and methods of operating the same.

BACKGROUND OF THE INVENTION

In some conventional integrated circuit devices, to control the current through output pads, a plurality of open drain output buffers, which are connected to the output pads, are turned on or off. Typically, the plurality of open drain output buffers is controlled by a digital signal that comprises multiple bits. For example, each open drain output buffer may be associated with a bit of a digital signal and is turned on or off in response to the logic level of the digital signal bit. A termination resistance is controlled in a similar way to control the current through the output pads.

The current through the output pads and/or the termination resistance is an analog quantity that is controlled by a digital value. The current and/or the termination resistance changes by a specific amount whenever the corresponding digital value changes by 1 bit. The change of an analog value with respect to the minimum change of a digital value may be referred to as the resolution of the minimum change in the digital value. Because the resolution is limited, it may be difficult to accurately control an analog value of interest.

FIGS. 1A and 1B illustrate an analog value that is generated in response to a digital signal. FIGS. 1A and 1B illustrate potential errors that may occur when an analog value is controlled using a digital signal. For example, one error that can occur when the current through the output pads is controlled by the size of the open drain output buffer will be described with reference to FIGS. 1A and 1B.

Typically, the size of the open drain output buffer is determined by using a digital signal to control the open drain output buffers while determining if the current through the output pads reaches a reference current. Referring now to FIG. 1A, while an evaluation signal EVALS is driven to a logic high level, it is determined if the current through output pads (not shown) reaches a reference current value REFV while changing a digital signal. MIN_RES represents the minimum change in the current through the output pads when the least significant bit of the digital signal changes.

When the current through the output pads reaches the reference current value REFV, the evaluation signal EVALS is driven to a logic low level and respective bits of the digital signal are maintained at the logic levels they have when the evaluation signal EVALS is driven to the logic low level. As shown in FIG. 1A, the current through the output pads has an error ERR1 with respect to the reference current value REFV.

The error ERR1 may be equal to or less than the change in the current through the output pads with respect to the least significant bit change in a digital signal. In a typical Rambus DRAM, the reference current value REFV is approximately 30 mA, and the digital signal that controls open drain output buffers comprises 7 bits.

When the digital signal comprises 7 bits, the current through the output pads can be classified into 128 ($2^7$) levels. A device including the output pads may be designed such that the current through the output pads is more than the reference current value REFV so that the proper maximum current can be obtained even when the environment changes. In other words, the current through the output pads may be approximately 20% more than the reference current value REFV. Thus, for a typical Rambus DRAM, a maximum current of approximately 36 mA may flow through the output pads. The open drain output buffer may control a current through the output pads that ranges from about 36 mA to 70 mA according to the PVT (Process, Voltage, Temperature) conditions. As a result, the resolution of the least significant bit change in the digital signal is between about 0.3 mA and 0.6 mA.

It is generally desirable for the error range of the current through the output pads to be about −1.5 mA−+1.5 mA based on typical Rambus DRAM specifications. In other words, the difference between the current through the output pads and the reference current should fall into this range regardless of various manufacturing conditions, such as high or low temperature, a high or low supply voltage Vdd, and the like. Thus, it may be desirable for the resolution of a change in the least significant bit of the digital signal to be less than the range of about 0.3 mA–0.6 mA.

Referring now to FIG. 1B an error ERR2 between the current through the output pads and the reference current value REFV is relatively small. In other words, the difference between the current through the output pads and the reference current value REFV may be equal to the maximum value of the resolution of the least significant bit of the digital signal as shown in FIG. 1A or less than the minimum value of the resolution of the least significant bit of the digital signal as shown in FIG. 1B. Thus, the error with respect to a final target value can be reduced by decreasing the change in the current through the output pads with respect to a change in the least significant bit of the digital signal, i.e., the resolution of the least significant bit of the digital signal.

FIG. 2 illustrates a conventional digital control system for generating an analog value. Referring to FIG. 2, a comparing unit 240 compares an analog value ANALV, which is generated by an analog control unit 230, with a reference value REFV and generates a control signal CTRL based on the result of the comparison. The analog value ANALV may correspond to the current through the output pads and the reference value REFV may correspond to the reference current. If the analog value ANALV, i.e., the current through the output pads, is less than the reference value REFV, then the control signal CTRL is generated at a first level. If the analog value ANALV is greater than the reference value REFV, then the control signal CTRL is generated at a second level.

A counter 210 counts the number of pulses of a clock signal CLK in response to an evaluation signal EVALS. When the control signal CTRL is at the first level, the counter 210 increases the number of pulses of a clock signal CLK that it counts. When the control signal CTRL is at the second level, the counter 210 decreases the number of pulses of the clock signal CLK that it counts. In other words, as the analog value ANALV approaches the reference value REFV, the control signal CTRL is alternately generated at the first and second levels. As a result, the number of pulses of the clock signal CLK counted by the counter 210 alternately increases and decreases.

During repetition of counting up and down, the counter 210 outputs the number of pulses of the clock signal CLK as a count value SA when the evaluation signal EVALS is deactivated. The count value SA is stored in a register 220. The count value SA stored in the register 220 is output to the analog control unit 230. The analog control unit 230 generates the analog value ANALV, i.e., the current through output pads, in response to the count value SA. The current through the output pads has an error ERR1 or ERR2 with respect to a reference current value REFV associated therewith as shown in FIGS. 1A and 1B.

SUMMARY OF THE INVENTION

According to embodiments of the present invention, a control system comprises a digital control unit that is configured to generate a digital value responsive to a difference between an output analog value and a reference value. A control signal generating unit is configured to generate a control signal. An analog control unit comprises a first circuit that is configured to generate a first analog value responsive to the digital value and a second circuit that is configured to generate a second analog value responsive to the control signal. The second circuit is configured to generate the second analog value at a resolution that is twice that of a resolution of the first circuit with respect to a least significant bit of the digital value. The analog control unit is configured to combine the first and second analog values to generate the output analog value.

In accordance with other embodiments of the present invention, the control system further comprises a counting unit that comprises first and second counters that are configured to generate first and second counts, respectively, responsive to a clock signal, an evaluation signal, and the difference between the output analog value and the reference value. Moreover, the digital control unit is configured to generate the digital value responsive to the first and second counts and the control signal generating unit is configured to generate the control signal responsive to the evaluation signal.

In accordance with still other embodiments of the present invention, the first counter is configured to increase the first count when the reference value exceeds the output analog value and to maintain the first count otherwise and the second counter is configured to increase the second count when the reference value exceeds the output analog value and to decrease the second count otherwise.

In accordance with still other embodiments of the present invention, the digital control unit is further configured to generate the digital value as an average of the first and second counts rounded down to the nearest decimal if the first and second counts are different and to generate the digital value as the value of the first and second counts minus one if the first and second counts are identical.

In accordance with further embodiments of the present invention, the digital control unit comprises a comparing unit that is configured to determine whether the first and second counts are different or identical. A first calculating unit is configured to compute the digital value as an average of the first and second counts rounded down to the nearest decimal responsive to a determination by the comparing unit that the first and second counts are different. A second calculating unit is configured to compute the digital value by subtracting one from the value of the first and second counts responsive to a determination by the comparing unit that the first and second counts are identical. A storage unit is configured to store the digital value computed by the first or second calculating units.

In accordance with still further embodiments of the present invention, the control system further comprises a comparing unit that is configured to generate a second control signal that is indicative of the difference between the output analog value and the reference value. The first and second counters are responsive to the second control signal.

In accordance with other embodiments of the present invention, the first circuit of the analog control circuit comprises a plurality of output buffers comprising a plurality of control transistors, respectively. The plurality of control transistors is responsive to the digital value. The second circuit of the analog control circuit comprises a sub output buffer that comprises a sub control transistor. The sub control transistor is responsive to the control signal and is one-half the size of the control transistor that is responsive to the least significant bit of the digital value.

In accordance with still other embodiments of the present invention, a ratio of a size of the sub-control transistor that is responsive to an $n^{th}$ bit of the digital value to the size of the control transistor that is responsive to the least significant bit of the digital value is $2^{n-1}:1$, wherein the least significant bit corresponds to the 1st bit of the digital value.

In accordance with still other embodiments of the present invention, the plurality of control transistors and the sub control transistor are connected in parallel between an output pad and a reference potential. The output analog value is generated at the output pad.

Although described above primarily with respect to system embodiments of the present invention, it will be understood that the present invention may also be embodied as methods of operating a control system and/or circuit.

BRIEF DESCRIPTION OF THE DRAWINGS

Other features of the present invention will be more readily understood from the following detailed description of specific embodiments thereof when read in conjunction with the accompanying drawings, in which:

FIG. 8 is a flowchart that illustrates methods of generating an analog value responsive to a digital value in accordance with further embodiments of the present invention.

DETAILED DESCRIPTION OF PREFERRED EMBODIMENTS

Figure 1A:
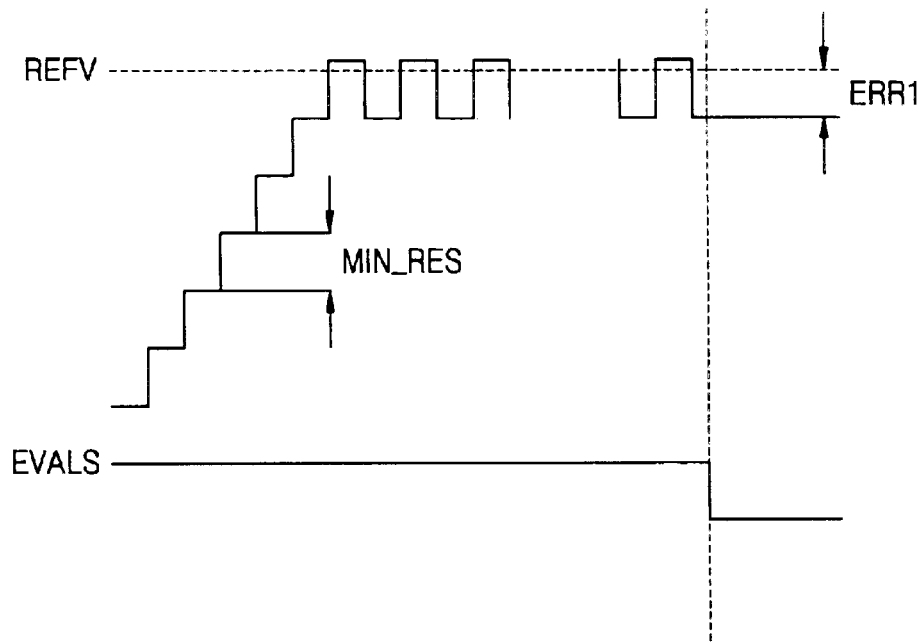
FIGS. 1A and 1B illustrate an analog value that is generated in response to a digital signal in accordance with a conventional control system.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures. It will also be understood that when an element is referred to as being "connected" or "coupled" to another element, it can be directly connected or coupled to the other element or intervening elements may also be present. In contrast, when an element is referred to as being "directly connected" or "directly coupled" to another element, there are no intervening elements present.

Figure 3:
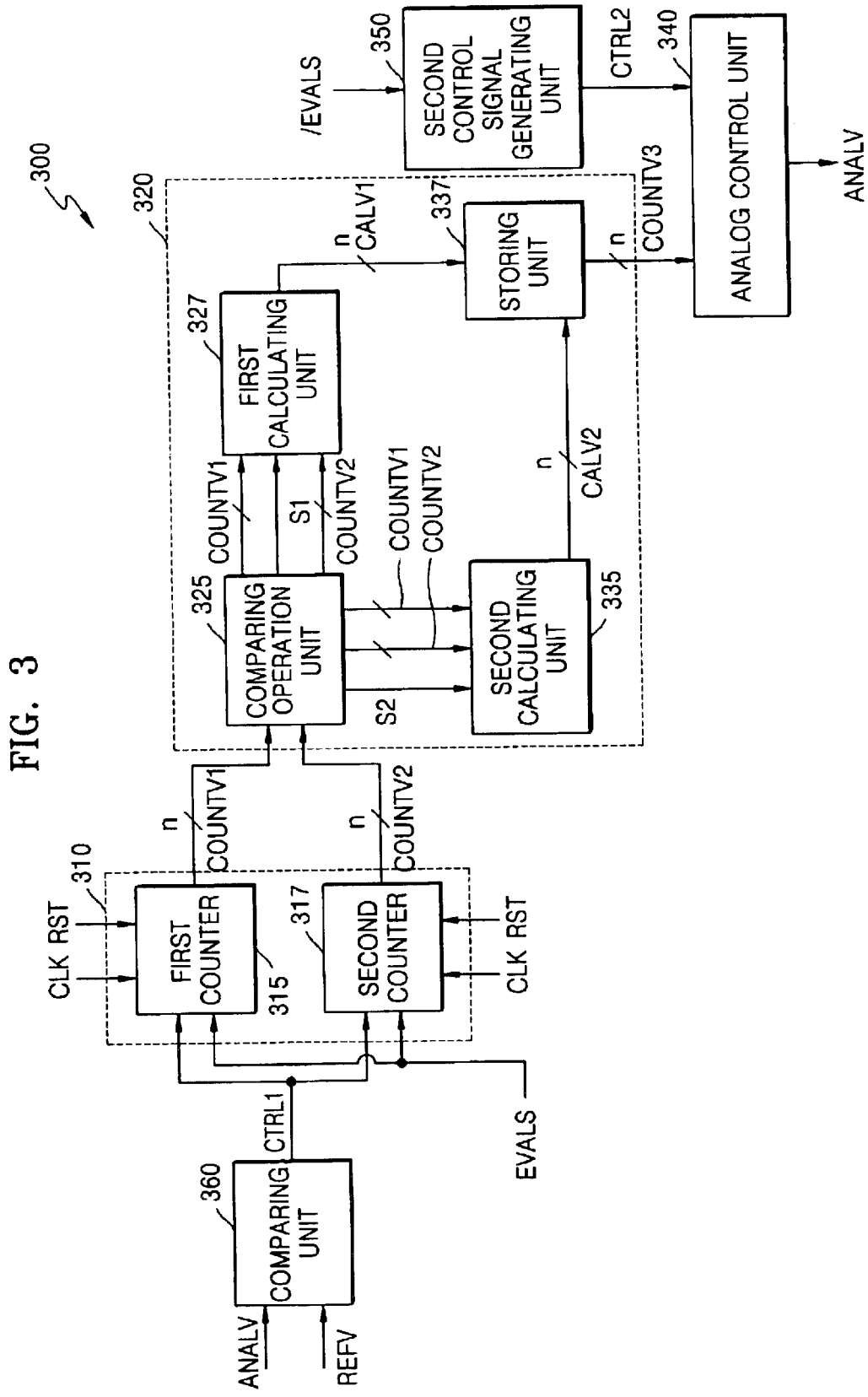
FIG. 3 is a block diagram that illustrates a control system according to some embodiments of the present invention.
Figure 7:
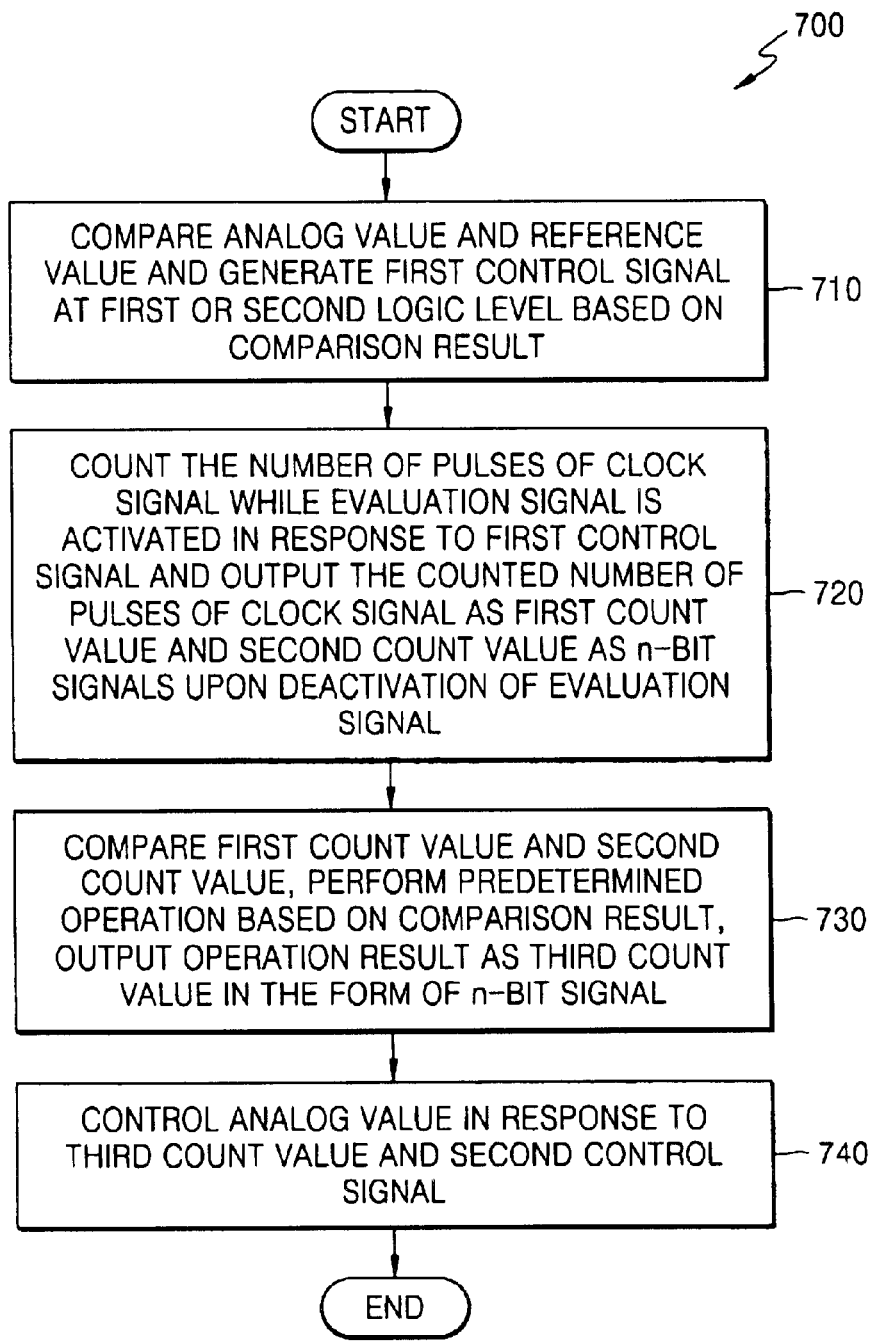
FIG. 7 is a flowchart that illustrates methods of generating an analog value responsive to a digital value in accordance with some embodiments of the present invention.

FIG. 3 is a block diagram that illustrates a control system according to some embodiments of the present invention. FIG. 7 is a flowchart that illustrates methods of generating an analog value responsive to a digital value in accordance with some embodiments of the present invention. As used herein, an "analog value" may be, for example, an analog voltage or an analog current. A conventional control system, which generates an analog value responsive to a digital signal, generally cannot fine-tune the analog value beyond the resolution of the least significant bit of the digital signal. In other words, the analog value may not be changed by a value less than the change in the analog value corresponding to a change in the least significant bit of the digital signal.

A control system 300, in accordance with some embodiments of the present invention, may provide a more precise resolution than that corresponding to the least significant bit of the digital signal. In some embodiments, a resolution corresponding to ½ the change in the least significant bit of the digital signal may be provided without increasing the number of bits in the digital signal.

Figure 1B:
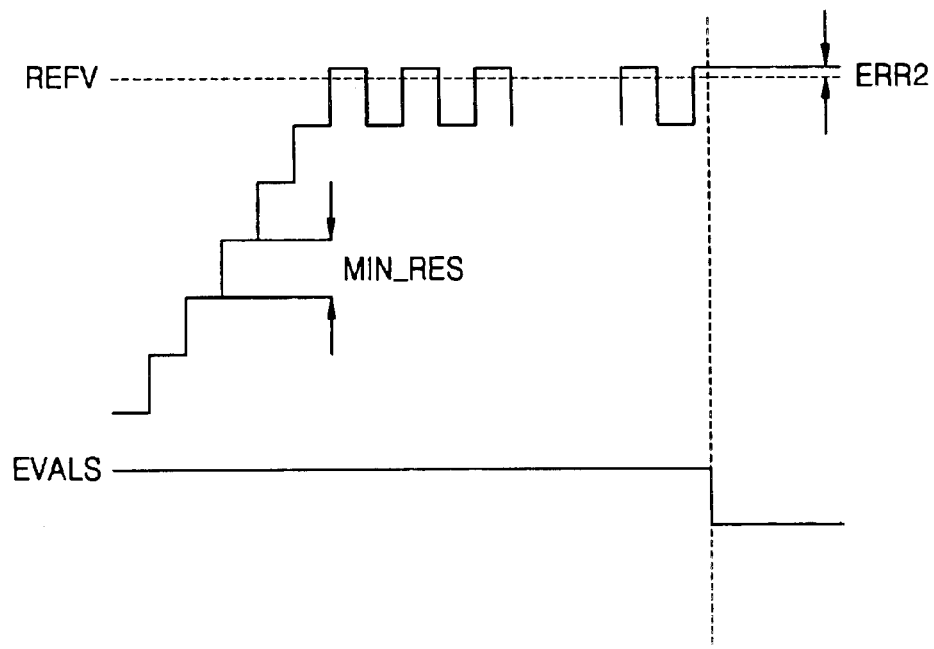

As discussed above with reference to FIGS. 1A and 1B, the least significant bit of the digital signal may be alternately set so that the analog value is lower or higher than a reference value REFV. In some cases, a current through output pads may be almost equivalent to the reference value REFV or it may differ from the reference value REFV by an amount of current corresponding to the resolution of the least significant bit of the digital signal.

According to some embodiments of the present invention, if the current through the output pads is set lower than the reference value REFV by an amount corresponding to the resolution of the least significant bit of the digital signal, then the amount of current corresponding to the resolution of ½ of the least significant bit of the digital signal is added to the current through the output pads so as to reduce the error between the current through the output pads and the reference value REFV. If the current through the output pads is set higher than the reference value REFV by an amount corresponding to the resolution of the least significant bit of the digital signal or less, then the current through the output pads is reduced by the amount of current corresponding to the resolution of ½ of the least significant bit of the digital signal so as to reduce the error between the current through output pads and the reference value REFV. Thus, according to the prior art, the maximum error in the current through the output pads is the current corresponding to the resolution of the least significant bit of the digital signal. Advantageously, in some embodiments of the present invention, the maximum error in the current through the output pads is the current corresponding to the resolution of ½ of the least significant bit of the digital signal.

Referring to FIGS. 3 and 7, an analog value and a reference value are compared and a first control signal CTRL1 at a first or second logic level is generated based on the comparison result (block 710). The control system 300 of FIG. 3 comprises a comparing unit 360 that compares an analog value ANALV with a reference value REFV and generates the first control signal CTRL1. The comparing unit 360 outputs the first control signal CTRL1 at the first logic level when the analog value ANALV is less than the reference value REFV. When the analog value ANALV is more than the reference value REFV, the comparing unit 360 outputs the first control signal CTRL1 at the second logic level.

An evaluation signal EVALS is activated in response to the first control signal CTRL1 allowing the number of pulses of a clock signal to be counted. Upon deactivation of the evaluation signal EVALS, the number of pulses of the clock signal is output as a first count value COUNTV1 and a second count value COUNTV2 as n-bit signals (block 720).

The counting unit 310 performs the operation of block 720. More specifically, in response to the first control signal CTRL1, the counting unit 310 counts the number of pulses of a clock signal CLK that are input while the evaluation signal EVALS is activated. Once the evaluation signal EVALS is deactivated, the counting unit 310 outputs the number of pulses of the clock signal CLK as the first count value COUNTV1 and the second count value COUNTV2, each as n-bit signals.

The counting unit 310 comprises a first counter 315 and a second counter 317. The first counter 315 operates in response to the evaluation signal EVALS. When the first control signal CTRL is at the first logic level, the first counter 315 counts the number of pulses of the clock signal CLK. Then, when the evaluation signal EVALS is deactivated, the first counter 315 outputs the number of pulses of the clock signal CLK as the first count value COUNTV1. The first counter 315 is not an up/down counter but a counter which counts up when the first control signal CTRL1 is at the first logic level and maintains a constant count value when the first control signal CTRL1 is at the second logic level, in accordance with some embodiments of the present invention.

When the first control signal CTRL1 is at the first logic level, the analog value ANALV is less than the reference value REFV. Thus, the first counter 315 continues increasing the first count value COUNTV1 until the analog value ANALV is greater than the reference value REFV. Then, once the analog value ANALV is greater than the reference value REFV and the first control signal CTRL1 transitions to the second logic level, the first counter 315 maintains the first count value COUNTV1. Once the evaluation signal EVALS is deactivated, the first counter 315 outputs the first count value COUNTV1.

The second counter 317 operates in response to the evaluation signal EVALS. When the first control signal CTRL1 is at the first logic level, the second counter 317 counts the number of pulses of the clock signal CLK by counting up in increasing fashion. When the first control signal CTRL1 is at the second logic level, the second counter 317 counts the number of pulses of the clock signal CLK by counting down in decreasing fashion. Once the evaluation signal EVALS is deactivated, the second counter 317 outputs the number of pulses of the clock signal CLK as the second count value COUNTV2.

The second counter 317 is an up/down counter. When the first control signal CTRL1 is at the first logic level, the analog value ANALV is less than the reference value REFV. Thus, the second counter 317 continues increasing the second count value COUNTV2 until the analog value ANALV is greater than the reference value REFV. Once the analog value ANALV is greater than the reference value REFV and the first control signal CTRL1 is at the second logic level, the second counter 317 begins decreasing the second count value COUNTV2. Thus, the second counter 317 repeats up-counting and down-counting based on the difference between the analog value ANALV and the reference value REFV. Once the evaluation signal EVALS is deactivated, the second counter 317 outputs the number of pulses of the clock signal CLK as the second count value COUNTV2.

As an example, assume that the reference value REFV is 30 mA as in a conventional Rambus DRAM and the first count value COUNTV1 and the second count value COUNTV2 are 7-bit signals. Also assume that the first counter 315 and the second counter 317 have first and second count values COUNTV1 and COUNTV2, respectively, equal to decimal 80 when the analog value ANALV is closest to, but still greater than the reference value REFV.

When the analog value ANALV closest to, but still less than the reference value REFV, the first counter 315 and the second counter 317 have first and second count values COUNTV1 and COUNTV2, respectively, equal to decimal 79. The analog value ANALV represents the current through the output pads and the reference value REFV represents the reference current. The first counter 315 and the second counter 317 operate while the evaluation signal EVALS is activated, but do not operate while the evaluation signal EVALS is deactivated. Also, the first counter 315 and the second counter 317 are reset in response to a reset signal RST. Once the evaluation signal EVALS is activated, the current through the output pads, i.e., the analog value ANALV, is measured by an analog control unit 340 and is then provided as an input to a comparing unit 360 that compares the analog value ANALV with the reference value REFV.

When the analog value ANALV is less than the reference value REFV, the comparing unit 360 generates the first control signal CTRL1 at the first logic level, which is provided as an input signal to the first counter 315 and the second counter 317. In response to the control signal CTRL1, the first counter 315 and the second counter 317 increase the first and second count values COUNTV1 and COUNTV2, respectively. When the analog value ANALV is just more than the reference value REFV, the first counter 315 and the second counter 317 have first and second count values COUNTV1 and COUNTV2, respectively, equal to decimal 80.

When the analog value ANALV is greater than the reference value REFV, the analog control unit 340 causes the analog value ANALV to decrease so that the analog value ANALV falls below the reference value REFV. The comparing unit 360 then generates the first control signal CTRL1 at the second logic level. Once the first control signal is generated at the second level, the first counter 315 maintains the current count value, i.e., decimal 80. The second counter 317 decreases the second count value COUTNV2 by 1 so that the second count value COUNTV2 is equal to decimal 79.

When the analog value ANALV is less than the reference value REFV, the analog control unit 340 causes the analog value ANALV to increase and the analog value ANALV becomes greater than the reference value REFV. The comparing unit 360 then generates the first control signal CTRL1 at the first logic level. The second counter 317 increases the second count value COUNTV2 by 1 so that the second count value COUNTV2 is equal to decimal 80. At this time, the first counter 315 maintains the current count value, i.e., decimal 80. In this way, the analog control unit 340 continues controlling the analog value ANALV to be close to the reference value REFV, and, thus, the second counter 317 repeats counting decimal 80 or 79.

When the analog value ANALV is closest to the reference value REFV, the evaluation signal EVALS is deactivated. The first counter 315 outputs decimal 80 as the first count value COUNTV1 and the second counter 317 outputs either decimal 79 or 80 as the second count value COUNTV2. The first counter 315 outputs a binary number of 7 bits corresponding to decimal 80 as the first count value COUNTV1 and the second counter 317 outputs a binary number of 7 bits corresponding to decimal 79 or 80 as the second count value COUNTV2.

Figure 2:
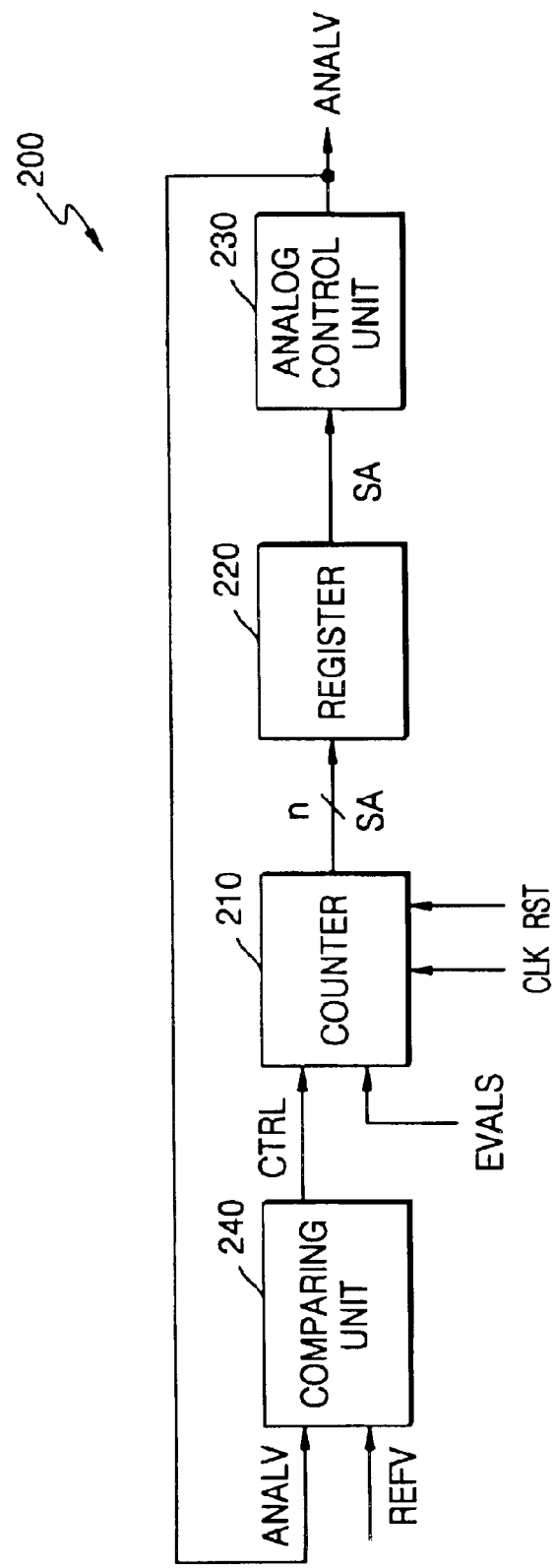
FIG. 2 illustrates a conventional digital control system for generating an analog value.

The conventional control system 200 of FIG. 2 measures the analog value ANALV that is closest to the reference value REFV, turns the open drain output buffer on or off using the count value SA at the moment when the analog value ANALV is closest to the reference value REFV, and fixes the analog value ANALV. Thus, the analog value ANALV will have a certain error with respect to the reference value REFV. The control system 300 and the control method 700, according to some embodiments of the present invention, use the first count value COUNTV1 and the second count value COUNTV2 to obtain a more accurate analog value ANALV.

At block 730, the first count value COUNTV1 and the second count value COUNTV2 are compared, operations are performed based on the comparison result, and then a result is output as a third count value COUNTV3 in the form of an n-bit signal. More specifically, a digital control unit 320 compares the first count value COUNTV1 and the second count value COUNTV2, performs operations based on the comparison result, and then outputs a result as the third count value COUNTV3 in the form of an n-bit signal. In accordance with some embodiments of the present invention, the digital control unit 320 comprises a comparing operation unit 325, a first calculating unit 327, a second calculating unit 335, and a storing unit 337 as shown in FIG. 3.

When the first count value COUNTV1 and the second count value COUNTV2 are different, the comparing operation unit 325 generates a first signal S1. When the first count value COUNTV1 and the second count value COUNTV2 are identical, the comparing operation unit 325 generates a second signal S2. In response to the first signal S1, the first calculating unit 327 sums the first count value COUNTV1 and the second value COUNTV2, obtains the average value of the sum of the first count value COUNTV1 and the second value COUNTV2, and generates a first calculation value CALV1 by rounding down to the decimal value nearest the average value.

If the first count value COUNTV1 is a binary number corresponding to decimal 80 and the second count value COUNTV2 is a binary number corresponding to decimal 79, then the comparing operation unit 325 generates the first signal S1. The first calculating unit 327 obtains the average value of the sum of decimal 80 and 79 and generates decimal 79 as the first calculation value CALV1 by discarding the digit 5 after the decimal point from the average value of 79.5.

When the first count value COUNTV1 and the second count value COUNTV2 are identical, the comparing unit 360 outputs the second signal S2 to the second calculating unit 335. In response to the second signal S2, the second calculating unit 335 outputs the value that is obtained by deducting 1 from the first count value COUNTV1 as a second calculation value CALV2.

When the first count value COUNTV1 and the second count value COUNTV2 are identical, both the first count value COUNTV1 and the second count value COUNTV2 are decimal 80. The second calculating unit 335 outputs the value obtained by deducting 1 from decimal 80, i.e., 79, as the second calculation value CALV2.

The storing unit 337 stores the first calculation value CALV1 or the second calculation value CALV2 and generates the stored value as the third count value COUNTV3. In other words, the storing unit 337 stores a binary number corresponding to decimal 79 and outputs the binary number as the third count value COUNTV3. The third count value COUNTV3 is provided to the analog control unit 340 and controls the analog value ANALV.

Once the evaluation signal EVALS is deactivated, a second control signal generating unit 350 generates a second control signal CTRL2. The analog control unit 340 is responsive to both the second control signal CTRL2 and the third count value COUNTV3. However, the analog control unit 340 generates the analog value ANALV at twice the resolution in response to the second control signal CTRL2 than it does in response to the third count value COUNTV3. That is, the analog value ANALV changes half as much in response to the second control signal CTRL2 as it does in response to the third count value COUNTV3.

Thus, the analog control unit 340 is responsive to binary numbers corresponding to the third count value COUNTV3, e.g., binary numbers corresponding to decimal 79, and the second control signal CTRL2, which is a single bit. The binary number obtained corresponds to decimal 79.5. Because the current through the output pads is responsive to a value that has a resolution measured in five-tenths, e.g., a decimal value of 79.5, the analog value ANALV may be more accurately generated in contrast to conventional control systems in which the current through the output pads is responsive to value that has a resolution measured in ones, e.g., a decimal value of 79 or 80.

Returning to FIG. 7, the analog value ANALV is generated by the analog control unit 340 responsive to the third count value COUNTV3 and the second control signal CTRL2 (block 740). The analog control unit 340 generates the analog value ANALV in response to the third count value COUNTV3 and the second control signal CTRL2 of 1 bit that provides a resolution of half of the minimum analog value that varies in response to the minimum change in the third count value COUNTV3.

The analog control unit 340 includes a first circuit that is responsive to the third Count value COUNTV3 and a second circuit that is responsive to the second control signal CTRL2. The second circuit provides a resolution of half of the minimum analog value that varies in response to the minimum change in the third count value COUNTV3.

Figure 4:
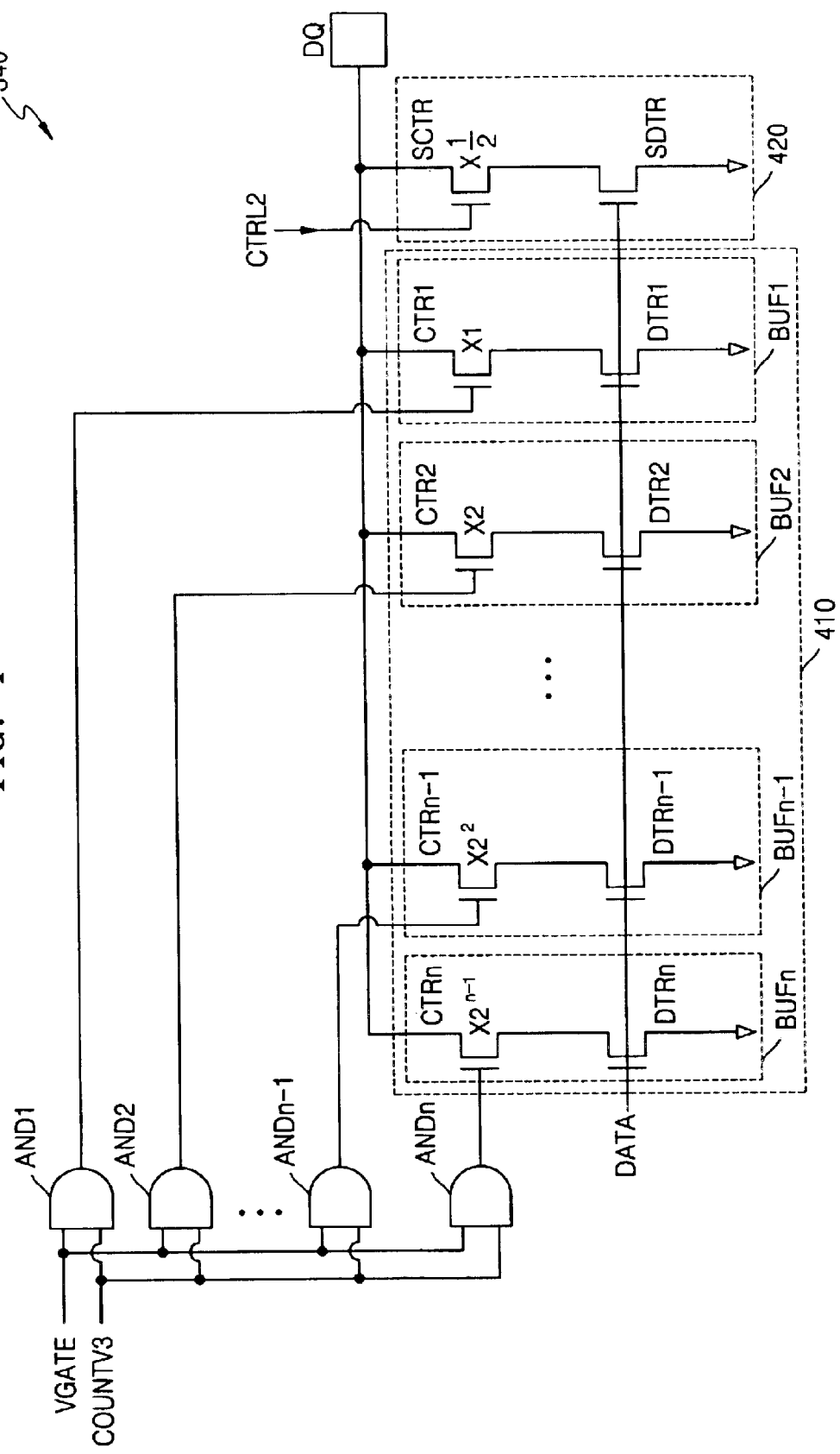
FIG. 4 is a schematic of an analog control unit in accordance with some embodiments of the present invention.

FIG. 4 is a schematic of the analog control unit 340 of FIG. 3 in accordance with some embodiments of the present invention. The analog control unit 340 may vary with respect to the application of the control system 300, but, for purposes of illustration, will be described here on the assumption that the control system 300 is applied to an output driver of a general Rambus DRAM.

The analog control unit 340 of FIG. 4 comprises first through $n^{th}$ open drain output buffers BUF1–BUFn and a sub open drain output buffer 420. The first through $n^{th}$ open drain output buffers BUF1–BUFn correspond to a first circuit 410 and the sub open drain output buffer 420 corresponds to a second circuit.

The first through $n^{th}$ open drain output buffers BUF1–BUFn are configured such that control transistors CTR1–CTRn, which are turned on or off in response to bits comprising the third count value COUNTV3, and data transistors DTR1–DTRn, which receive data DATA, are connected in series. The first through $n^{th}$ open drain output buffers BUF1–BUFn control the current through an output pad DQ.

The sub open drain output buffer 420 is configured such that a control transistor SCTR, which is turned on or off in response to the second control signal CTRL2, and a data transistor SDTR, which receives the data DATA, are connected in series. The sub open drain output buffer 420 controls the current through the output pad DQ.

The third count value COUNTV3 along with a gate control signal VGATE are provided to control transistors CTR1–CTRn via AND gates AND1–ANDn. Because the gate control signal VGATE is generated at a high logic level, control transistors CTR1–CTRn are turned on or off in response to the third count value COUNTV3.

The first bit of the third count value COUNTV3 is input to the control transistor CTR1 of the first open drain output buffer BUF1. Similarly, the $n^{th}$ bit of the third count value COUNTV3 is input to the control transistor CTRn of the $n^{th}$ open drain output buffer BUFn. When the third count value COUNTV3 is decimal 79, each bit of the 7 bits corresponding to decimal 79, i.e., each bit of 1001111, is input to the corresponding control transistors CTR1–CTRn.

The ratio of the size of the control transistor CTR1 of the first open drain output buffer BUF1 to the size of the control transistor CTRn of the $n^{th}$ open drain output buffer BUFn is 1 to $2^{n-1}$. The control transistor SCTR of the sub open drain output buffer 420 is half the size of the control transistor CTR1 of the first open drain output buffer BUF1. The current through the output pad DQ, controlled by the third count value COUNTV3, may have an error associated therewith corresponding to a 1-bit change in the third count value COUNTV3.

Because the control transistor SCTR of the sub open drain output buffer 420 is turned on or off in response to the second control signal CTRL2, however, the current through the output pad DQ can be adjusted by an amount corresponding to half the current associated with a 1-bit change in the third count value COUNTV3.

Figure 5A:
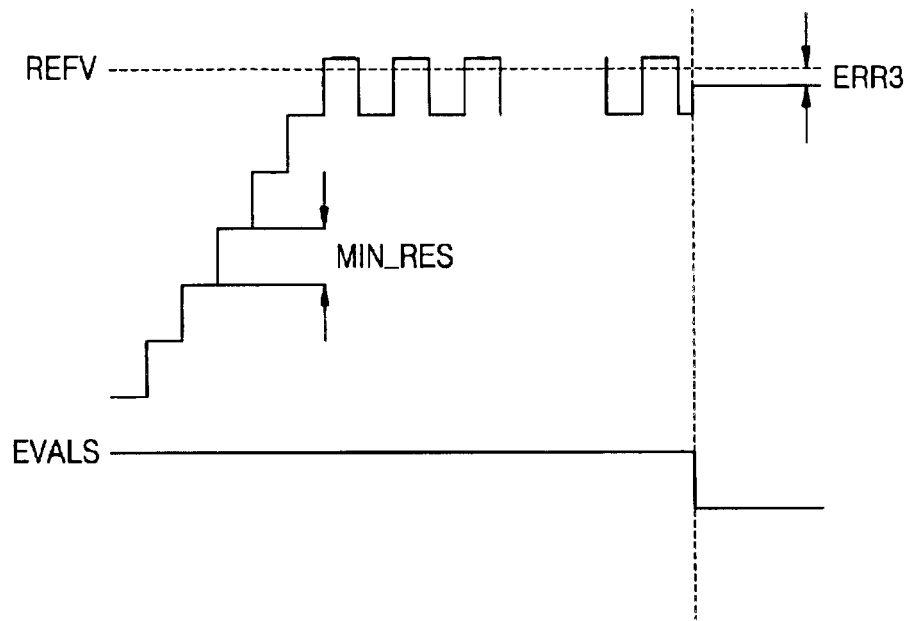
FIGS. 5A and 5B illustrate an analog value ANALV that is generated by a control system in accordance with some embodiments of the present invention.
Figure 5B:
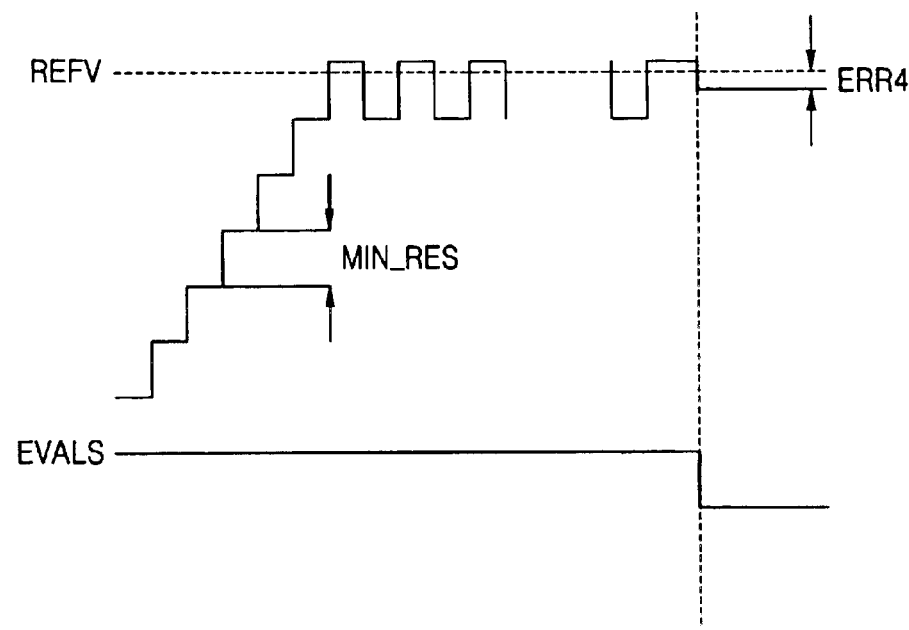

FIGS. 5A and 5B illustrate an analog value ANALV that is generated by the control system 300 in accordance with some embodiments of the present invention. FIG. 5A illustrates an example where the current through the output pad DQ is increased when the first count value COUNTV1 and the second count value COUNTV2 are different when the evaluation signal EVALS is deactivated. FIG. 5B illustrates an example where the current through the output pad DQ is reduced when the first count value COUNTV1 and the second count value COUNTV2 are identical when the evaluation signal EVALS is deactivated.

Figure 6A:
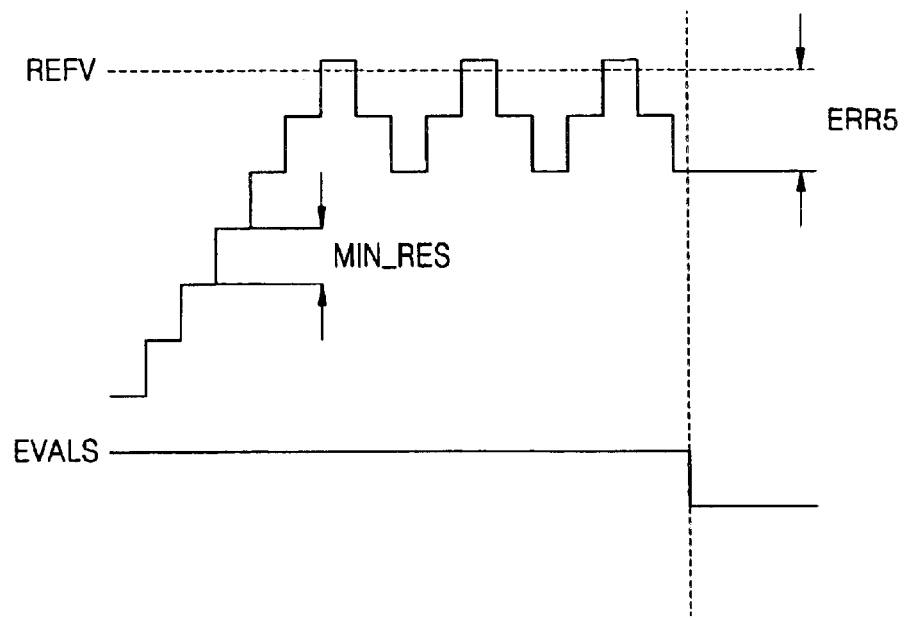
FIGS. 6A and 6B illustrate analog errors that can occur when an analog value increases and decreases by 2 about a reference value.
Figure 6B:
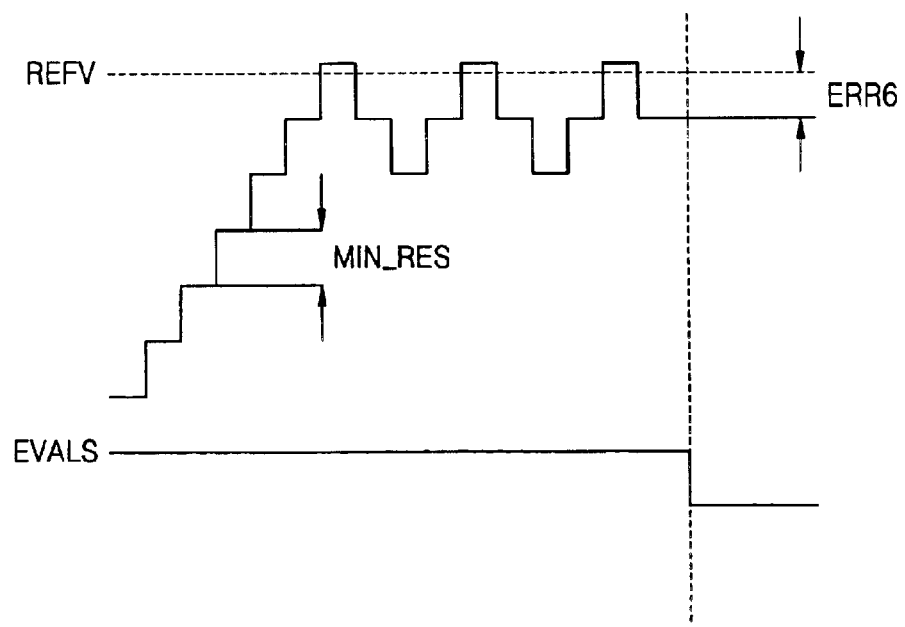

FIGS. 6A and 6B illustrate analog errors that occur when the analog value ANALV increases and decreases by 2 about a reference value. FIG. 6A illustrates an example where the current through the output pad DQ is less than the reference value REFV by the current through the output pad DQ when the digital signal changes by 2. FIG. 6B illustrates an example where the current through the output pad DQ is less than the reference value REFV by the current through the output pad DQ when the digital signal changes by 1. In other words, in contrast to exemplary embodiments of the present invention, it may be difficult to predict errors ERR5 and ERR6 between the amount of the current through the output pad DQ and the reference value REFV with the conventional control system 200 of FIG. 2.

Advantageously, even when an analog error associated with a change of 2 in the digital signal occurs, the control system 300 can perform precise analog control in the same way as when an analog error associated with a change of 1 in the digital signal occurs.

According to some embodiments of the present invention, errors between the analog value ANALV and the reference value REFV associated with a change of 2 in the digital signal may be addressed by the control system of FIG. 3. For example, when the first counter 315 of FIG. 3 outputs decimal 80 as the first count value COUNTV1 and the second counter 317 of FIG. 3 outputs decimal 78 as the second count value COUNTV2, the third count value COUNTV3 is output as decimal 79. The first calculating unit 327 obtains an average value of decimal 80 and 78 and rounds down, thereby obtaining decimal 79. Thus, if the third count value COUNTV3 and the second control signal CTRL2 are summed up, the result is decimal 79.5. Thus, because the current through the output pads is responsive to a value that has a resolution measured in five-tenths, e.g., a decimal value of 79.5, the analog value ANALV may be more accurately generated in contrast to conventional control systems.

FIG. 8 is a flowchart that illustrates methods of generating an analog value responsive to a digital value in accordance with further embodiments of the present invention. A method 800 is directed to a method of controlling the current through the output pad DQ of an output driver circuit that includes first through $n^{th}$ open drain output buffers wherein the control transistor and the data transistor are connected in series, and a sub open drain output buffer wherein the control transistor and the data transistor are connected in series. The method 800 of FIG. 8 illustrates an example where the control system 300 and the control method 700 are applied to an output driver circuit of a general Rambus DRAM including open drain output buffers. Hereinafter, the method 800 of FIG. 8 will be described with reference to the control system 300 of FIG. 3 and FIG. 4.

At block 810, the comparing unit 360 determines whether the current through the output pad DQ is closest to the reference current. In other words, the current through the output pad DQ and the reference current are compared. The current through the output pad DQ corresponds to the analog value ANALV, and the reference current corresponds to the reference value REFV. Hereinafter, the current through the output pad DQ and the reference current will be used instead of the analog value ANALV and the reference value REFV.

When the current through the output pad DQ is closest to the reference current, the digital control unit 320 determines a first digital signal of n bits, which turns the control transistors of the first through $n^{th}$ open drain output buffers on or off, at block 820. The first digital signal is determined when the current through the output pad DQ is less than and closest to the reference current. The first digital signal corresponds to the third count value COUNTV3 of FIG. 3.

In response to the first digital signal of n bits, the current through the output pad DQ is generated by the analog control unit 340 by controlling the control transistors of the first through $n^{th}$ open drain output buffers (block 830). The control transistors CTR1–CTRn of the first through $n^{th}$ open drain output buffers BUF1–BUFn of FIG. 4 are turned on or off in response to respective bits of the first digital signal, thereby controlling the current through the output pad DQ.

In response to a second digital signal, the current through the output pad DQ is also generated by controlling the control transistor of the sub open drain output buffer (block 840). The second digital signal turns on the control transistor SCTR of the sub open drain output buffer 420, thus increasing the current through the output pad DQ.

The second digital signal corresponds to the second control signal CTRL2 of FIG. 3. The second digital signal is generated in response to the deactivation of the evaluation signal EVALS. The size of the control transistor SCTR of the sub open drain output buffer 420 is half the size of the control transistor CTR1 of the first open drain output buffer BUF1. The size of the control transistor CTR1 of the first open drain output buffer BUF1 is the smallest among the control transistors CTR1–CTRn of the first through $n^{th}$ open drain output buffers BUF1–BUFn.

According to a conventional control system, the resolution of the current through the output pad DQ depends on the size of the control transistor CTR1 of the first open drain output buffer BUF1. However, according to some embodiments of the present invention, it is possible to control the current through the output pad DQ more precisely by turning the control transistor SCTR of the sub open drain output buffer 420 on or off using the second digital signal.

As described above, control systems and control methods according to embodiments of the present invention are advantageous in that it is possible to control a final target value using a half of the amount of change in an analog value corresponding to least significant bit of a digital signal. Also, it is possible to more precisely control the current through the output pad connected to the output driver circuit.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

That which is claimed:

1. A control system, comprising:
   a digital control unit that is configured to generate a digital value responsive to a difference between an output analog value and a reference value;
   a control signal generating unit that is configured to generate a control signal; and
   an analog control unit that comprises a first circuit that is configured to generate a first analog value responsive to the digital value and a second circuit that is configured to generate a second analog value responsive to the control signal, the second circuit being configured to generate the second analog value at a resolution that is twice that of a resolution of the first circuit with respect to a least significant bit of the digital value, the analog control unit being configured to combine the first and second analog values to generate the output analog value.

2. The control system of claim 1, further comprising:
   a counting unit that comprises first and second counters that are configured to generate first and second counts, respectively, responsive to a clock signal, an evaluation signal, and the difference between the output analog value and the reference value;

wherein the digital control unit is configured to generate the digital value responsive to the first and second counts; and wherein the control signal generating unit is configured to generate the control signal responsive to the evaluation signal.

3. The control system of claim 2, wherein the first counter is configured to increase the first count when the reference value exceeds the output analog value and to maintain the first count otherwise; and wherein the second counter is configured to increase the second count when the reference value exceeds the output analog value and to decrease the second count otherwise.

4. The control system of claim 3, wherein the digital control unit is further configured to generate the digital value as an average of the first and second counts rounded down to the nearest decimal if the first and second counts are different and to generate the digital value as the value of the first and second counts minus one if the first and second counts are identical.

5. The control system of claim 4, wherein the digital control unit comprises:

a comparing unit that is configured to determine whether the first and second counts are different or identical;

a first calculating unit that is configured to compute the digital value as an average of the first and second counts rounded down to the nearest decimal responsive to a determination by the comparing unit that the first and second counts are different;

a second calculating unit that is configured to compute the digital value by subtracting one from the value of the first and second counts responsive to a determination by the comparing unit that the first and second counts are identical; and a storage unit that is configured to store the digital value computed by the first or second calculating units.

6. The control system of claim 2, wherein the control signal is a first control signal, the system further comprising:

a comparing unit that is configured to generate a second control signal that is indicative of the difference between the output analog value and the reference value, the first and second counters being responsive to the second control signal.

7. The control system of claim 1, wherein the first circuit of the analog control circuit comprises a plurality of output buffers comprising a plurality of control transistors, respectively, the plurality of control transistors being responsive to the digital value; and wherein the second circuit of the analog control circuit comprises a sub output buffer that comprises a sub control transistor, the sub control transistor being responsive to the control signal and being one-half the size of the control transistor that is responsive to the least significant bit of the digital value.

8. The circuit of claim 7, wherein a ratio of a size of the sub-control transistor that is responsive to an $n^{th}$ bit of the digital value to the size of the control transistor that is responsive to the least significant bit of the digital value is $2^{n-1}:1$, wherein the least significant bit corresponds to the 1st bit of the digital value.

9. The control system of claim 7, wherein the plurality of control transistors and the sub control transistor are connected in parallel between an output pad and a reference potential, the output analog value being generated at the output pad.

10. A circuit, comprising:

a first circuit that is configured to generate a first analog value responsive to a digital value; and a second circuit that is configured to generate a second analog value responsive to a control signal, the second circuit being configured to generate the second analog value at a resolution that is twice that of a resolution of the first circuit with respect to a least significant bit of the digital value, the analog control unit being configured to combine the first and second analog values to generate an output analog value.

11. The circuit of claim 10, wherein the first circuit comprises a plurality of output buffers comprising a plurality of control transistors, respectively, the plurality of control transistors being responsive to the digital value; and wherein the second circuit comprises a sub output buffer that comprises a sub control transistor, the sub control transistor being responsive to the control signal and being one-half the size of the control transistor that is responsive to the least significant bit of the digital value.

12. The circuit of claim 11, wherein a ratio of a size of the sub-control transistor that is responsive to an $n^{th}$ bit of the digital value to the size of the control transistor that is responsive to the least significant bit of the digital value is $2^{n-1}:1$, wherein the least significant bit corresponds to the 1st bit of the digital value.

13. A method of operating a control system, comprising:

generating a digital value responsive to a difference between an output analog value and a reference value;

generating a control signal;

generating a first analog value responsive to the digital value;

generating a second analog value responsive to the control signal at a resolution that is twice that of a resolution associated with a least significant bit of the digital value; and generating the output analog value by combining the first and second analog values.

14. The method of claim 13, further comprising:

generating first and second counts responsive to a clock signal, an evaluation signal, and the difference between the output analog value and the reference value;

wherein generating the digital value comprises generating the digital value responsive to the first and second counts; and wherein generating the control signal comprises generating the control signal responsive to the evaluation signal.

15. The method of claim 14, wherein generating the first count comprises increasing the first count when the reference value exceeds the output analog value and maintaining the first count otherwise; and wherein generating the second count comprises increasing the second count when the reference value exceeds the output analog value and decreasing the second count otherwise.

16. The method of claim 15, wherein generating the digital value comprises:

generating the digital value as an average of the first and second counts rounded down to the nearest decimal if the first and second counts are different; and generating the digital value as the value of the first and second counts minus one if the first and second counts are identical.

17. A control system for performing analog control, comprising:
- a counting unit, which counts a number of clock signals that are input while an evaluation signal is activated in response to a first control signal and, upon deactivation of the evaluation signal, outputs the counted number of clock signals as a first count value of n bits and a second count value of n bits;
- a digital control unit, which compares the first count value and the second count value, performs a predetermined operation based on the comparison result, and outputs the operation result as a third count value of n bits; and
- an analog control unit, which controls an analog value in response to the third count value and receives a second control signal of 1 bit that can control a half of a minimum analog value that varies in response to a minimum change in the third count value.

18. The control system of claim 17, wherein the second control signal is generated upon deactivation of the evaluation signal.

19. The control system of claim 17, further comprising a comparing unit which compares the analog value with a reference value and generates the first control signal.

20. The control system of claim 17, wherein the counting unit comprises:
- a first counter, which operates in response to the evaluation signal, counts up when the first control signal is at a first level, and outputs the count value as the first count value upon deactivation of the evaluation signal; and
- a second counter, which operates in response to the evaluation signal, counts up when the first control signal is at the first level, counts down when the first control signal is at a second level, and outputs the count value as the second count value upon deactivation of the evaluation signal.

21. The control system of claim 20, wherein the first counter and the second counter operate when the evaluation signal is activated, do not operate when the evaluation signal is deactivated, and are reset in response to a reset signal.

22. The control system of claim 17, wherein the digital control unit comprises:
- a comparing operation unit, which generates a first signal when the first count value and the second count value are different and generates a second signal when the first count value and the second count value are identical;
- a first calculating unit, which, in response to the first signal, sums the first count value and the second count value, obtains an average value of the sum of the first count value and the second count value, and generates a first calculation value by rounding down the average value;
- a second calculating unit, which, in response to the second signal, generates a second calculation value by subtracting 1 from the first count value as a second calculation value; and
- a storing unit, which stores the first calculation value or the second calculation value and generates the stored value as the third count value.

23. The control system of claim 17, wherein the analog control unit comprises:
- a first circuit, which controls the analog value in response to the third count value; and
- a second circuit, which controls a half of a minimum analog value controlled by the first circuit in response to the second control signal.

24. The control system of claim 17, wherein the analog control unit comprises:
- first through $n^{th}$ open drain output buffers, each of which includes a control transistor that is turned on or off in response to a respective bit of the third count value and a data transistor that receives data, connected in series, and controls the current through an output pad; and
- a sub open drain output buffer, which includes a control transistor that is turned on or off in response to the second control signal and a data transistor that receives data, connected in series, and controls the current through the output pad.

25. The control system of claim 24, wherein the size ratio of the first through $n^{th}$ open drain output buffers is such that when the size of the control transistor of the first open drain output buffer is 1, the size of the control transistor of the $n^{th}$ open drain output buffer is $2^{n-1}$, and the size of the control transistor of the sub open drain output buffer is half of the control transistor of the first open drain output buffer.

26. A method of controlling an analog value, comprising:
- comparing an analog value with a reference value and generating a first control signal at a first level or second level based on the comparison result;
- counting the number of pulses of clock signals while an evaluation signal is activated in response to the first control signal and outputting the counted number of clock signals as a first count value of n bits and a second count value of n bits upon deactivation of the evaluation signal;
- comparing the first count value and the second count value, performing a predetermined operation based on the comparison result, and outputting the operation result as a third count value of n bits; and
- controlling the analog value in response to the third count value and receiving a second control signal of 1 bit that can control a half of a minimum analog value that varies in response to a minimum change in the third count value.

27. The method of claim 26, wherein the second control value is generated upon deactivation of the evaluation signal.

28. The method of claim 26, wherein counting the number of pulses further comprises:
- counting up when the first control signal is at the first level and outputting the count value as the first count value upon deactivation of the evaluation signal; and
- counting up when the first control signal is at the first level, counting down when the first control signal is at a second level, and outputting the count value as the second count value upon deactivation of the evaluation signal.

29. The method of claim 26, wherein comparing the first count value and the second count value further comprises:
- comparing the first count value and the second count value to determine whether the first count value and the second count value are identical;
- when the first count value and the second count value are not identical, summing up the first count value and the second count value, obtaining an average value of the summed result, and generating a first calculation value by rounding down the average value;
- when the first count value and the second count value are identical, generating a second calculation value by deducting 1 from the first calculation value; and
- storing the first calculation value or the second calculation value and generating the stored value as a third calculation value.

30. The method of claim 26, wherein controlling the analog value further comprises:

controlling the analog value in response to the third count value; and controlling a half of a minimum analog value that varies in response to the second control signal.

* * * * *